United States Patent
Fujita et al.

(10) Patent No.: US 6,238,488 B1
(45) Date of Patent: May 29, 2001

(54) METHOD OF CLEANING FILM FORMING APPARATUS, CLEANING SYSTEM FOR CARRYING OUT THE SAME AND FILM FORMING SYSTEM

(75) Inventors: Yoshiyuki Fujita, Esashi; Jun Hirai, Ichinoseki; Azusa Iitaka, Morioka; Tatsuya Tamura, Esashi, all of (JP)

(73) Assignee: Tokyo Electron Limited, Osaka (JP)

( * ) Notice: Subject to any disclaimer, the term of this patent is extended or adjusted under 35 U.S.C. 154(b) by 0 days.

(21) Appl. No.: 09/320,451

(22) Filed: May 27, 1999

(30) Foreign Application Priority Data

May 29, 1998 (JP) .................................................. 10-166099

(51) Int. Cl.[7] ...................................................... B08B 7/04
(52) U.S. Cl. ............................ 134/18; 134/19; 134/22.1; 118/715; 118/724
(58) Field of Search .............................. 134/18, 19, 22.1, 134/42; 156/345 MT, 345 V; 438/905; 118/724, 715

(56) References Cited

U.S. PATENT DOCUMENTS

| | | | |
|---|---|---|---|
| 5,016,663 | * | 5/1991 | Mase et al. ............................... 134/1 |
| 5,029,554 | * | 7/1991 | Miyashita et al. .................... 118/715 |
| 5,169,407 | * | 12/1992 | Mase et al. ............................... 134/1 |
| 5,380,370 | * | 1/1995 | Niino et al. ........................ 134/22.11 |
| 5,578,132 | * | 11/1996 | Yamaga et al. ....................... 118/724 |
| 5,637,153 | * | 6/1997 | Niino et al. ........................ 134/22.11 |

FOREIGN PATENT DOCUMENTS

| | | |
|---|---|---|
| 1-231936 | 9/1989 | (JP) . |
| 3-31479 | 2/1991 | (JP) . |
| 4-155827 | 5/1992 | (JP) . |
| 4-157161 | 5/1992 | (JP) . |
| 6-151396 | 5/1994 | (JP) . |
| 7-297127 | 11/1995 | (JP) . |
| 11-131267 | 5/1999 | (JP) . |

* cited by examiner

*Primary Examiner*—Randy Gulakowski
*Assistant Examiner*—Saeed Chaudhry
(74) *Attorney, Agent, or Firm*—Smith, Gambrell & Russell, LLP

(57) ABSTRACT

A cleaning gas is supplied into a processing chamber defined by a processing vessel included in a film forming system, and the temperature of a gas contained in the processing vessel is measured continuously for a predetermined time by a gas temperature measuring means disposed in the processing vessel. The temperature measured by the gas temperature measuring means rises gradually while the cleaning gas flowing through the processing chamber is reacting with an unnecessary film deposited on the surfaces of the processing vessel. A cleaning operation terminating point is determined on the basis of the time-varying measured temperature of the gas measured by the gas temperature measuring means. Preferably, the cleaning operation terminating point determining means determines that the cleaning operation is to be terminated at a time point a certain time after the variation of the measured temperature past a peak. Consequently, the cleaning operation terminating point can exactly be determined so that the unnecessary film can substantially completely be removed without causing insufficient cleaning or overetching.

18 Claims, 2 Drawing Sheets

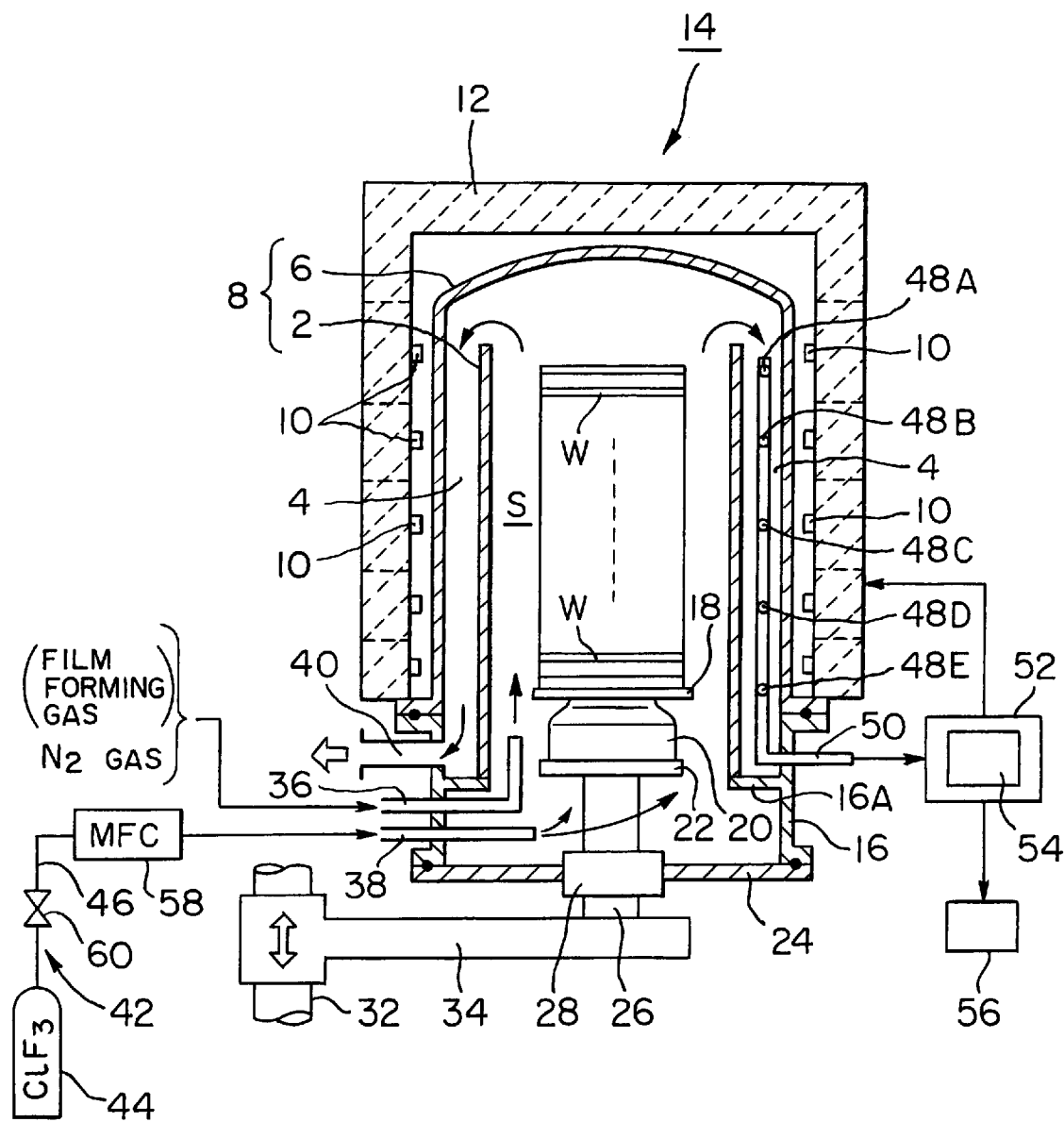
F I G. 1

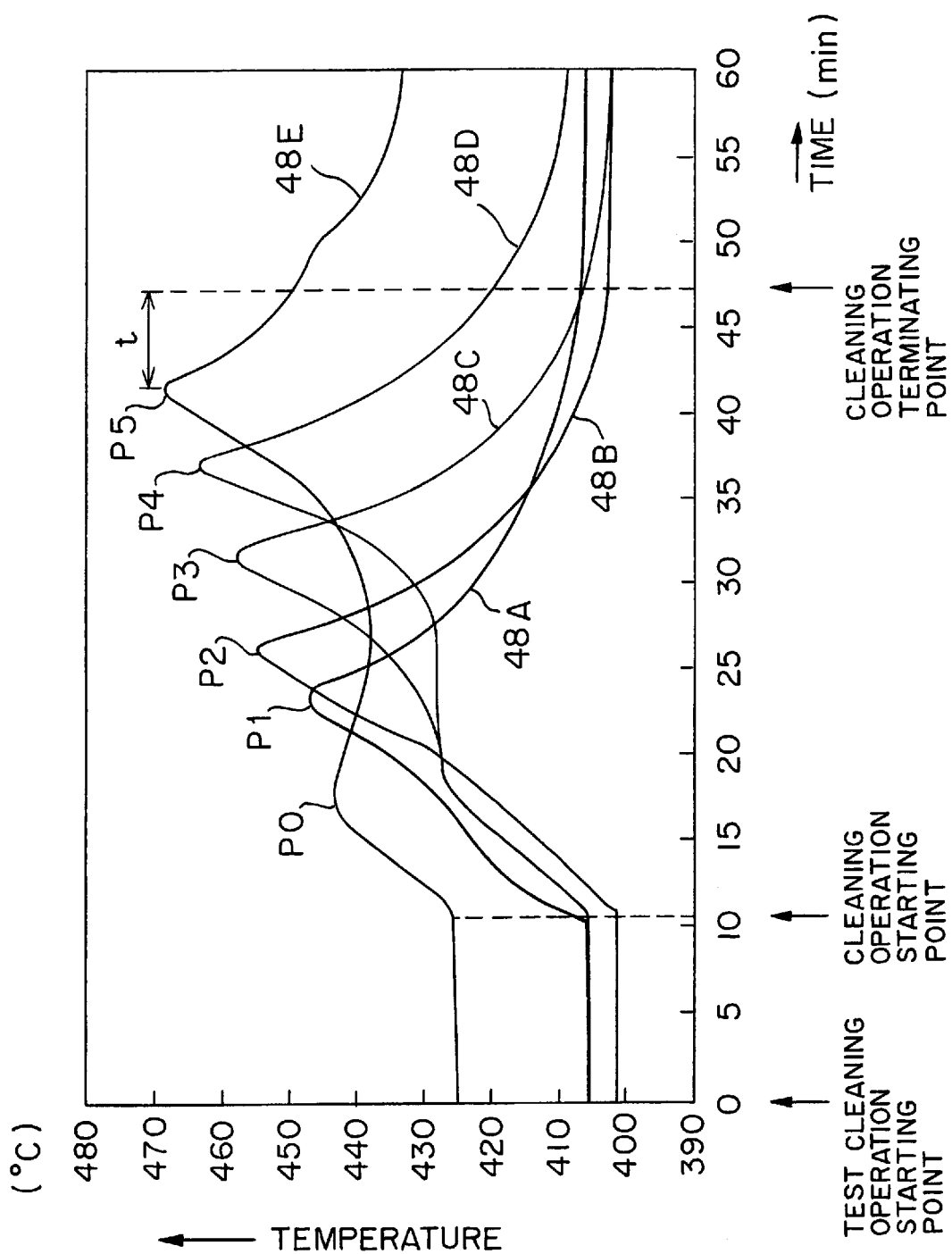
F I G. 2

METHOD OF CLEANING FILM FORMING APPARATUS, CLEANING SYSTEM FOR CARRYING OUT THE SAME AND FILM FORMING SYSTEM

BACKGROUND OF THE INVENTION

1. Field of the Invention

The present invention relates to a method of cleaning a film forming apparatus for forming a film on a workpiece, such as a semiconductor wafer, a cleaning system for carrying out the same, and a film forming system.

2. Description of the Related Art

A semiconductor wafer is subjected to various processes including a film forming process and an etching process to fabricate a semiconductor integrated circuit thereon. When simultaneously forming films respectively on a plurality of semiconductor wafers by a CVD system, the semiconductor wafers are arranged at equal intervals on a wafer boat, the wafer boat holding the semiconductor wafers is placed in an evacuated vacuum processing vessel, the semiconductor wafers are heated at a predetermined temperature, and then process gases for forming a film is supplied into the processing vessel to deposit a substance produced by the decomposition or the chemical reaction of the process gases in a film on the semiconductor wafers.

When thus forming the films on the surfaces of the semiconductor wafers, unnecessary films are deposited on surfaces not intended to be coated with any film, such as the inner surface of the processing vessel and the surface of the wafer boat. Such unnecessary films deposited on such surfaces not intended to be coated with any film come off in floating particles and the particles adhere to films deposited on the semiconductor wafers to cause defects in semiconductor integrated circuits fabricated on the semiconductor wafers. Therefore, the vacuum processing vessel is cleaned periodically or at indeterminate intervals.

Cleaning is needed not only by the hot-wall processing vessels of batch type LP-CVD systems (low-pressure chemical vapor deposition systems), but also by single wafer film forming systems.

It has been a common practice to clean the hot-wall processing vessel of an LP-CVD system for periodic cleaning by a wet cleaning method using a chemical liquid regardless of the type of the processing vessel, either a vertical type or a horizontal type.

The wet cleaning method, however, needs time for maintenance, increases downtime and has the following problems in view of productivity.

① Removal and installation of the quartz reaction tube requires complicated, troublesome work.

② Work for removing the quartz reaction tube must be suspended for a long time necessary for cooling the heater.

③ Work for the leakage inspection and the temperature profile inspection of the quarts reaction tube takes much time.

A most efficient means for solving such problems is removing films deposited by CVD on the surfaces of the LP-CVD system by on-site cleaning without disassembling the LP-CVD system, that is, making the LP-CVD system clean itself. Cleaning methods using $ClF_3$ gas as an etching gas for cleaning a hot-wall type LP-CVD system are proposed in JP-A Nos. 3-31479, 4-155827 and 6-151396. These cleaning methods supply a cleaning gas containing $ClF_3$ gas into the processing vessel to remove unnecessary films deposited on the wafer boat and the inner surface of the processing vessel.

Determination of a cleaning operation terminating point where the cleaning operation is to be terminated is important in carrying out the cleaning operation. The unnecessary films cannot satisfactorily be etched and fragments of the unnecessary films will remain on the wafer boat and the inner surface of the processing vessel if the cleaning time is not long enough to remove all the unnecessary films completely. The quartz wafer boat and the processing vessel will react with and will be etched by the highly reactive $ClF_3$ gas and fine particles will be formed on the surfaces of the quartz wafer boat and the processing vessel if the cleaning time is excessively long.

Accordingly, it has been a common practice to subject a sample wafer similar to in-process wafers as a monitor to a film forming process together with the in-process wafers. A cleaning operation is started upon the increase of the cumulative amount of a film deposited on the sample wafer to a predetermined amount, and the cleaning operation is terminated upon the elapse of a predetermined cleaning time necessary for removing the predetermined amount of the film estimated on the basis of a cleaning rate determined beforehand.

However, the cumulative amount of the film deposited on the sample wafer does not necessarily coincide with and, in most cases, is different from the amount of the film deposited on the wafer boat or the inner surface of the processing vessel. Process conditions are not necessarily fixed; for example, process temperature is changed, and a dopant is added to or any dopant is not added to polysilicon films. Consequently, a plurality of layers of different materials are deposited on the wafer boat and the inner surface of the processing vessel. Since films of different materials are etched at different etch rates, respectively, it is considerably difficult to determine exactly a cleaning operation terminating point where the cleaning operation is to be terminated on the basis of the cleaning rate (etch rate) determined beforehand.

Therefore, the cleaning operation is continued for a cleaning time slightly shorter than that may be necessary, the cleaning operation is interrupted to examine the remaining unnecessary film and then the cleaning operation is resumed and continued for an additional cleaning time determined through the examination of the remaining unnecessary film. Thus the cleaning operation takes a long cleaning time.

SUMMARY OF THE INVENTION

The present invention has been made in view of the foregoing problems to solve those problems effectively and it is therefore an object of the present invention to provide a method of cleaning a film forming apparatus, capable of exactly determining a cleaning operation terminating point where a cleaning operation is to be terminated.

Another object of the present invention is to provide a cleaning system for carrying out a method of cleaning a film forming apparatus, capable of exactly determining a cleaning operation terminating point where a cleaning operation is to be terminated.

A third object of the present invention is to provide a film forming system provided with a cleaning system for carrying out a method of cleaning a film forming apparatus, capable of exactly determining a cleaning operation terminating point where a cleaning operation is to be terminated.

The inventors of the present invention made earnest studies of an etching operation using an etching gas, and found that the reactivity of a polysilicon film with an etching gas is about several tens times that of quartz with the same etching gas, and hence the chemical reaction of a polysilicon film with an etching gas generates a large amount of heat of reaction. The present invention has been made on the basis of such a finding.

According to a first aspect of the present invention, a cleaning method of cleaning a film forming system for processing a workpiece by a film forming process comprises the steps of: producing currents of a cleaning gas in a processing chamber defined by a processing vessel included in the film forming system to clean the processing vessel; continuously measuring the temperature of the gas contained in the processing vessel for a necessary time by a gas temperature measuring means disposed in the processing vessel; and determining a cleaning operation terminating point on the basis of the variation of measured temperature measured by the gas temperature measuring means with time. Preferably, the step of determining a cleaning operation terminating point determines the cleaning operation terminating point upon the variation of the measured temperature past a peak.

The temperature measured by the gas temperature measuring means rises gradually while the cleaning gas flowing through the processing chamber reacts with a deposited unnecessary film and etches the same. The measured temperature reaches a peak when a part of the unnecessary film around the gas temperature measuring means is etched. Then the measured temperature starts decreasing from the peak after all the part of the unnecessary film around the gas temperature measuring means has been removed by etching. The time when the measured temperature starts decreasing from the peak is selected as a cleaning operation terminating point where the cleaning operation is to be terminated. Practically, a time point a predetermined time, such as several minutes, after a time point when the measured temperature starts decreasing from the peak is selected as a cleaning operation terminating point because there is some possibility that some part of the unnecessary film still remains at the time point when the measured temperature starts decreasing from the peak. Thus, it is possible to determine the cleaning operation terminating point so that the unnecessary film can surely be removed by etching without causing overetching.

Desirably, the gas temperature measuring means is disposed in a downstream region with respect to the flowing direction of the cleaning gas in the processing chamber.

The measured temperature measured by the gas temperature measuring means rises gradually while the cleaning gas flowing through the processing chamber is reacting with and etching the unnecessary film. The cleaning gas starts etching a part of the unnecessary film around the gas temperature measuring means after the same has completely etched a part of the unnecessary film on the upstream side of the gas temperature measuring device. At this cleaning stage, the measured temperature reaches a peak. The measured temperature starts decreasing after the part of the unnecessary film around the gas temperature measuring means has completely been removed. The time when the measured temperature starts decreasing from the peak is selected as a cleaning operation terminating point where the cleaning operation is to be terminated. Practically, a time point a predetermined time, such as several minutes, after the time point when the measured temperature starts decreasing from the peak is selected as a cleaning operation terminating point because there is some possibility that some part of the unnecessary film still remains at the time point when the measured temperature starts decreasing from the peak. Thus, it is possible to determine the cleaning operation terminating point so that the unnecessary film can completely be removed by etching without causing overetching.

If the processing vessel comprises an inner cylinder and an outer cylinder disposed coaxially with the inner cylinder so as to define an annular space between the inner and the outer cylinder, the gas temperature measuring means is disposed near an exhaust port formed in the outer cylinder. Since the cleaning gas starts etching a part of the unnecessary film around the gas temperature measuring means after the same has completely etched a part of the unnecessary film on the upstream side of the gas temperature measuring means, the cleaning operation terminating point can properly be determined. The peak of the measured temperature as a basis for determining the cleaning operation terminating point is the second peak of the measured temperature during the cleaning operation because the cleaning gas supplied in a bottom region of a space defined by the inner cylinder cleans the inner surface of the inner cylinder from a lower part of the inner surface upward, and then cleans the inner surface of the outer cylinder and the outer surface of the inner cylinder from an upper part downward, and the measured temperature reaches the first peak when the cleaning gas cleans the lower part of the inner surface of the inner cylinder. The cleaning gas may be, for example, $ClF_3$ gas. The gas temperature measuring means measures the temperature of a gas derived from the cleaning gas in the processing vessel.

According to a second aspect of the present invention, a cleaning system for carrying out the cleaning method in accordance with the present invention to clean a film forming system which processes a workpiece by a film forming process by supplying a process gas into a processing chamber defined by a processing vessel comprises a cleaning gas supply means for supplying the cleaning gas into the processing vessel, a gas temperature measuring means disposed in the processing vessel to measure the temperature of a gas in the processing chamber, and a cleaning operation terminating point determining means for determining a cleaning operation terminating point where a cleaning operation is to be terminated on the basis of the time-varying measured temperature of the gas measured by the gas temperature measuring means. Preferably, the cleaning operation terminating point determining means determines that the cleaning operation is to be terminated at a time point a certain time after the variation of the measured temperature past the peak.

Desirably, the processing vessel comprises an inner cylinder and an outer cylinder disposed coaxially with the inner cylinder so as to define an annular space between the inner and the outer cylinder, and the gas temperature measuring means is disposed near an exhaust port formed in the outer cylinder to discharge the gas from the processing vessel. The cleaning operation terminating point determining means determines that the cleaning operation is to be terminated upon the variation of the measured temperature past the second peak. A thermocouple inserted in the annular space to monitor temperature during a film forming process may be used as the cleaning gas temperature measuring means.

According to a third aspect of the present invention, a film forming system for processing a workpiece by a film forming process comprises a processing vessel defining a processing chamber through which a process gas flows, and a cleaning system for cleaning the interior of the processing vessel, in which the cleaning system comprises a cleaning gas supply means for supplying a cleaning gas into the processing vessel, a gas temperature measuring means disposed in the processing vessel to measure the temperature of a gas in the processing chamber, and a cleaning operation terminating point determining means for determining a cleaning operation terminating point when a cleaning operation is to be terminated on the basis of the time-varying measured temperature of the gas measured by the gas temperature measuring means.

The film forming system in accordance with the present invention is capable of properly determining the cleaning operation terminating point.

BRIEF DESCRIPTION OF THE DRAWINGS

FIG. 1 is a schematic sectional view of a film forming system for carrying out a cleaning method in a preferred embodiment according to the present invention; and FIG. 2 is a graph of assistance in explaining the relation between measured temperatures measured by thermocouples and a cleaning operation terminating point.

DESCRIPTION OF THE PREFERRED EMBODIMENTS

A film forming system cleaning method, a cleaning system and a film forming system embodying the present invention will be described hereinafter with reference to the accompanying drawings.

FIG. 1 shows a film forming system for carrying out a cleaning method in accordance with the present invention. In the following description, the film forming system is supposed to be a vertical LP-CVD system. The film forming system has a double-wall processing vessel 8 formed by coaxially disposing a cylindrical inner cylinder 2 of quartz and a cylindrical outer cylinder 6 of quartz so as to form an annular space 4 between the inner cylinder 2 and the outer cylinder 6. A processing chamber S for processing semiconductor wafers W, i.e., workpieces is defined inside of the processing vessel 8. The processing vessel 8 is covered with a heating furnace 14 comprising heating elements 10 and an insulating structure 12. The heating elements 10 are arranged over the entire inner surface of the insulating structure 12.

The processing vessel 8 is supported at its lower end by a cylindrical manifold 16 of, for example, a stainless steel. The inner cylinder 2 is supported at its lower end on an annular support plate 16A extending inward from the inner surface of the manifold 16. A quarts wafer boat 18 holding a plurality of semiconductor wafers W, i.e., workpieces, can vertically moved so as to be inserted from below the manifold 16 into the manifold 16.

The wafer boat 18 is supported on a heat insulating pedestal 20 mounted on a turning table 22. The turning table 22 is supported on a rotating shaft 26 extended through an opening formed in a lid 24 for closing and opening the open lower end of the manifold 16.

A magnetic fluid seal 28 seals the gap between the rotating shaft 26 and the opening formed in the lid 24, and supports the rotating shaft 26 for rotation. A sealing member 30, such as an O ring, is held between a peripheral part of the lid 24 and the lower end surface of the manifold 16 to seal the processing vessel 8.

The rotating shaft 26 is supported on a free end part of an arm 34 supported on an elevating mechanism 32, such as a boat elevator. The elevating mechanism 32 moves the wafer boat 18 together with the lid 24 in vertical directions.

A process gas supply pipe 36 and a cleaning gas supply pipe 38 are connected to the side wall of the manifold 16, and an exhaust port 40 is formed in the side wall of the manifold 16. A source gas and an inert gas, such as $N_2$ gas, are supplied through the process gas supply pipe 36 into the inner cylinder 2. An inner end part of the process gas supply pipe 36 is bent in an L-shape. A cleaning gas is supplied through the cleaning gas supply pipe 38 into the processing vessel 8. An inner end part of the cleaning gas supply pipe 38 is straight. A gas prevailing in the processing vessel 8 is discharged from a lower part of the annular space 4 formed between the inner cylinder 2 and the outer cylinder 6 through the exhaust port 40. A vacuum exhaust system, not shown, including a vacuum pump is connected to the exhaust port 40. A cleaning gas supply system 42 is connected to the cleaning gas supply pipe 38. The cleaning gas supply system 42 has a cleaning gas source 44, and a cleaning gas supply line 46 connected to the cleaning gas source 44. The cleaning gas supply line 46 is provided with a flow controller 58, such as a mass-flow controller, and a shutoff valve 60. The flow controller 58 controls the flow of the cleaning gas. The cleaning gas is $ClF_3$ gas.

The heating furnace 14 is divided into a plurality of vertically arranged heating zones, such as five heating zones to control temperature in the overall region of the heating furnace 14. The heating elements 10 are disposed so as to correspond to the heating zones, respectively. Heating temperature measuring devices, not shown, for measuring heating temperature are disposed near the heating elements 10, respectively, to control the heating elements 10 individually.

Five thermocouples 48A to 48E for monitoring temperatures in the heating zones are sealed in a protective pipe 50 of quartz.

The protective pipe 50 is set in the annular space 4 between the inner cylinder 2 and the outer cylinder 6 so that the thermocouples 48A to 48E correspond to the heating zones, respectively. A lower end part of the protective pipe 50 is bent so as to penetrate the side wall of the manifold 16. The gap between the protective pipe 50 and the side wall of the manifold 16 is sealed hermetically. The thermocouples 48A to 48E are used also as cleaning gas temperature measuring means for measuring the temperature of gases including the cleaning gas flowing through the processing chamber S during a cleaning operation. A cleaning operation terminating point is determined on the basis of temperature measured particularly by the lowermost thermocouple 48E disposed in a lower end region of the annular space 4, i.e., the thermocouple nearest to the exhaust port 40.

Signals provided by the thermocouples 48A to 48E and representing measured temperatures are given to a controller 52, such as a microcomputer. During a film forming process, the levels of power supplied to the heating elements 10 for the heating zones are controlled individually on the basis of the signals provided by the thermocouples 48A to 48E. Thus, the respective temperatures of the heating elements 10 can individually be controlled. The controller 52 is internally provided with a cleaning operation terminating point determining device 54 for determining a cleaning operation terminating point on the basis of the signals provided by the thermocouples 48A to 48E during a cleaning operation. The cleaning operation terminating point determining device 54 controls the cleaning operation.

The cleaning gas supply system 42, the thermocouples (cleaning gas temperature measuring means) 48A to 48E, and the cleaning operation terminating point determining device 54 constitute a cleaning system. The controller 52 includes a monitor 56 for displaying information including temperatures measured by the thermocouples 48A to 48E, and a cleaning operation terminating point. The cleaning operation can manually be controlled by an operator on the basis of information displayed on the monitor 58.

A film forming process to be carried out by the film forming system thus constructed will be described below.

When the film forming system is in a waiting state with any wafers not loaded into the film forming system, the processing vessel 8 is maintained at a process temperature of, for example, 600° C. or a temperature lower than the process temperature. The wafer boat 18 holding a plurality of wafers W of an ordinary temperature is elevated from below the processing vessel 8 into the processing vessel 8 to load the wafers W into the processing vessel 8. Then, the open lower end of the manifold 16 is closed by the lid 24 so as to seal the processing vessel 8.

The pressure in the processing vessel 8 is adjusted to a process pressure for the film forming process, and the wafers W are heated to a process temperature. After the wafers W have been stabilized at the process temperature, a predetermined film forming gas, such as silane gas is supplied through the process gas supply pipe 36 into the processing vessel 8. The film forming gas is supplied through the process gas supply pipe 36 into a bottom region of the interior of the inner cylinder 2. The film forming gas touches the wafers W being turned in the atmosphere of the film forming gas, and reacts with the wafers W to form a film on the wafers W. The film forming gas flows upward through the inner cylinder 2 toward the upper end wall of the outer cylinder 6, flows downward through the annular space 4 between the inner cylinder 2 and the outer cylinder 6, and is discharged outside the processing vessel 8 through the exhaust port 40. Thus, a film, such as a polysilicon film, is deposited on the wafers W. The levels of power supplied to the heating elements 10 corresponding to the heating zones are controlled on the basis of temperatures measured by the thermocouples 48A to 48E to control the respective temperatures of the heating zones during the film forming process.

As the film forming process is repeated, an unnecessary film, such as a polysilicon film, is deposited unavoidably on the surfaces of the quartz members exposed to the film forming gas little by little. The unnecessary film is deposited on the wafer boat 18, the inner and the outer side surface of the inner cylinder 2, the inner side surface of the outer cylinder 6, and the outer side surface of the protective pipe 50 containing the thermocouples 48A to 48E.

Accordingly, the cleaning operation is carried out to remove the unnecessary film which will produce particles after the film forming process has been repeated a predetermined number of times.

The empty wafer boat 18 is placed in the processing vessel 8 during the cleaning operation. The processing vessel 8 is heated and maintained at a predetermined temperature by the heating elements 10, and the cleaning gas, i.e., $ClF_3$, is supplied at a controlled flow rate through the cleaning gas supply pipe 38 into a bottom region of the interior of the inner cylinder 2. At the same time, an inert gas, such as $N_2$ gas, i.e., a diluent gas, is supplied through the process gas supply pipe 36 into the inner cylinder 2.

A mixed gas of the cleaning gas and the inert gas, similarly to the film forming gas, flows upward through the inner cylinder 2 toward the upper end wall of the outer cylinder 6, flows downward through the annular space 4 between the inner cylinder 2 and the outer cylinder 6, and is discharged outside the processing vessel 8 through the exhaust port 40. The unnecessary film deposited on the surfaces exposed to $ClF_3$ gas is etched and removed little by little. The exothermic reaction of $ClF_3$ gas with the unnecessary polysilicon film evolves a considerable amount of heat. Quartz is less reactive with $ClF_3$ gas than polysilicon. Therefore, a cleaning operation terminating point can be determined by monitoring temperatures measured by the thermocouples 48A to 48E, particularly, temperature measured by the lowermost thermocouple 48E nearest to the exhaust port 40.

More specifically, a time point when the temperature measured by the lowermost thermocouple 48E starts decreasing after reaching a peak is a cleaning operation terminating point because of the following reasons. All parts of the film adhering to different parts of the processing vessel 8 are not etched simultaneously at the same etch rate; the parts of the film nearer to the upstream end of the passage of the cleaning gas are etched and removed earlier than those of the film farther from the upstream end of the passage of the cleaning gas. Accordingly, a time point when a part of the film corresponding to the lowermost thermocouple 48E disposed at the downstream of the passage of the cleaning gas is removed and the temperature measured by the lowermost thermocouple 48E starts decreasing from a peak corresponds to a time point when all parts of the film are removed.

First, parts of the unnecessary film adhering to a lower part of the wafer boat 18 and a lower part of the inner surface of the inner cylinder 2 are removed substantially completely by etching, and then parts of the unnecessary film adhering to an upper part of the wafer boat 18 and an upper part of the inner surface of the inner cylinder 2 are etched gradually.

When a part of the unnecessary film adhering to the inner surface of the upper end wall of the processing vessel 8, i.e., the upper end wall the outer cylinder 6, is etched, parts of the unnecessary film on the surfaces defining the annular space 4, i.e., the outer surface of the inner cylinder 2 and the inner surface of the outer cylinder 6, start to be removed. Then the position of a cleaning action changes gradually downward. At the same time, the position of a cleaning action on the unnecessary film deposited on the outer surface of the quartz protective pipe 50 containing the thermocouples 48A to 48E shifts gradually downward. As mentioned above, the exothermic reaction of $ClF_3$ gas with the unnecessary polysilicon film deposited on the protective pipe 50 evolves a considerable amount of heat. Accordingly, a time point when a part of the film corresponding to the lowermost thermocouple 48E is removed and the temperature measured by the lowermost thermocouple 48E starts decreasing from a peak corresponds to a time point when all parts of the film corresponding to all the thermocouples 48 are removed, i.e., a cleaning operation terminating point when the unnecessary film is removed completely. Practically, a time point several minutes after the time point when the temperature measured by the lowermost thermocouple 48E starts decreasing from the peak is selected as a cleaning operation terminating point to ensure complete removal of the unnecessary film without causing overetching. Upon the determination of the cleaning operation terminating point, the supply of the cleaning gas is stopped automatically or manually.

The film forming system was subjected practically to a test cleaning operation to verify the relation between temperatures measured by the thermocouples during the cleaning operation and the cleaning operation terminating point. Results of the test cleaning operation will be explained with reference to FIG. 2.

FIG. 2 is a graph showing the variation of temperatures measured by the thermocouples 48A to 48E with time. The supply of a cleaning gas, i.e., a mixture of $ClF_3$ gas and $N_2$ gas, was started about 10 minutes after the start of the test cleaning operation to start cleaning the processing vessel 8. A time point about 47 minutes after the start of the test cleaning operation was a cleaning operation terminating point. Cleaning conditions were 400° C. in the temperature of the processing vessel 8, 1.0 Torr in the pressure in the processing vessel 8, 1800 sccm in the flow rate of $ClF_3$ gas and 3200 sccm in the flow rate of $N_2$ gas. The outer cylinder 6 was about 300 mm in diameter and about 1270 mm in height, and the inner cylinder 2 was about 260 mm in diameter and about 1260 mm in height.

A region around the lowermost thermocouple 48E nearest to the exhaust port 40 is heated at a relatively high temperature of about 425° C. at the start of the cleaning operation to make temperature distribution in the processing chamber S uniform by compensating the region around the lowermost thermocouple 48E for its heat loss, because the amount of heat transferred from the region around the lowermost thermocouple 48E to the manifold 16 is greater than those of heat transferred from the other regions around the other thermocouples.

As is obvious from FIG. 2, the temperatures measured by the thermocouples increase gradually after the start of the cleaning operation because reaction heat is generated during the cleaning operation. Rates of increase of the temperatures measured by some of the thermocouples decrease temporarily at time about 10 minutes after the start of the cleaning operation.

The temperature measured by the lowermost thermocouple 48E reaches a pseudo peak P0. Then, the temperatures measured by the thermocouples 48A, 48B, 48C and 48D reach peaks P1, P2, P3 and P4 successively in that order, and the temperature measured by the lowermost thermocouple 48E reaches a peak P5 last. Such a mode of variation of the temperatures measured by the thermocouples 48A to 48E represents a mode of variation of reaction heat generated when the unnecessary film adhering to the protective pipe 50 containing the thermocouples 48A to 48E is removed gradually from an upper part toward a lower part thereof by the cleaning operation. Accordingly, it is determined that the cleaning of the processing vessel is completed when the temperature measured by the lowermost thermocouple 48E reaches the peak P5. The quartz surfaces of the processing vessel 8 and the protective pipe 50 are exposed when the unnecessary film is removed. Since quartz forming the processing vessel 8 and the protective pipe 50 is far less reactive with the cleaning gas than polysilicon forming the unnecessary film, the amount of heat generated by the interaction of the cleaning gas and the unnecessary film decreases sharply upon the completion of removal of the unnecessary film and hence the temperatures measured by the thermocouples start decreasing.

Practically, it is preferable to determine the cleaning operation terminating point at time a predetermined time t after a time point when the temperature measured by the lowermost thermocouple 48E reaches the peak P5.

The time when the temperature measured by the lowermost thermocouple 48E may be used as a cleaning operation terminating point. When the cleaning operation was terminated upon the increase of the temperature measured by the lowermost thermocouple 48E to the peak P5, only a small amount of residual polysilicon film which will not cause any problem was found on the outer surface of the inner cylinder 2 and the inner surface of the outer cylinder 6. When the cleaning operation was terminated at the cleaning operation terminating point the predetermined time t after a time point when the temperature measured by the lowermost thermocouple 48E reached the peak P5, there was no residual polysilicon film at all, there was no trace of overetching and the cleaning operation was achieved satisfactorily. The predetermined time t is dependent on the flow rate of the cleaning gas and cleaning temperature. In this embodiment, the predetermined time t is 5 minutes. When the cleaning operation was continued for about 10 minutes after the detection of the peak P5, there were traces of overetching in the processing vessel 8. Therefore, it is undesirable to continue the cleaning operation for about 10 minutes after the detection of the peak P5.

The cleaning operation was carried out under different cleaning conditions including temperature and the flow rate of the cleaning gas. It was found that the cleaning operation can efficiently be achieved when the pressure is in the range of 0.5 to 10 Torr, the temperature is in the range of 200 to 720° C., the flow rate of $ClF_3$ gas is in the range of 1600 to 2000 sccm and the flow rate of $N_2$ gas is in the range of 3000 to 3400 sccm.

In FIG. 2, the temperatures measured by all the thermocouples 48A to 48E are shown to facilitate understanding the transition of the position of a cleaning action. Practically, the cleaning operation terminating point may be determined on the basis of the variation of only the temperature measured by the lowermost thermocouple 48E and any reference need not necessarily be made to the temperatures measured by the other four thermocouples 48A to 48D disposed above the lowermost thermocouple 48E. The first peak P0, i.e., the pseudopeak, may be disregarded and the cleaning operation terminating point may be a time point the predetermined time t after a time point when the second peak P5 appears.

The thermocouples 48A to 48E for measuring temperature during the film forming process are used also as temperature measuring means for measuring the temperatures of gases including the cleaning gas. A thermocouple specially for measuring the temperature of the cleaning gas during the cleaning operation, i.e., a cleaning gas temperature measuring means, may be contained in a protective pipe and disposed at a position substantially corresponding to the position of the lowermost thermocouple 48E.

The cleaning gas temperature measuring means is used not only for measuring the temperature of the cleaning gas and the inert gas, but also for measuring the temperature of a gas produced by a cleaning action.

An inert gas other than $N_2$ gas, such as Ar gas or He gas, may be used. Any suitable cleaning gas other than $ClF_3$ gas, such as $NF_3$ gas, may be used.

Although the foregoing description has been made on an assumption that the unnecessary film is a polysilicon film, the present invention is applicable to removing films other than the polysilicon film, such as a doped polysilicon film doped with an impurity, a silicon nitride film and a tantalum oxide film.

Although the invention has been described as applied to the batch type film forming system provided with the double-wall processing vessel by way of example, the present invention is applicable also to a film forming system provided with a single-wall processing vessel and a single-substrate film forming system. When the present invention is applied to such film forming systems, a thermocouple, i.e., a cleaning gas temperature measuring means, contained in a protective pipe may be disposed at a position near a part of the unnecessary film which will be removed last, i.e., a position near an exhaust port on the downstream side of the processing vessel with respect to the flowing direction of the cleaning gas.

The workpieces need not be limited to semiconductor wafers, and the present invention is applicable to a film forming system for forming a film on glass substrates or substrates for LCDs.

As is apparent from the foregoing description, the method of cleaning a film forming system, the cleaning system and the film forming system of the present invention exercise the following excellent effects.

A time point the predetermined time after a time point when the temperature measured by the cleaning gas temperature measuring means during the cleaning operation starts decreasing from the peak is selected as the cleaning operation terminating point. Therefore, the cleaning operation terminating point can properly be determined so that the unnecessary film can substantially completely be removed without causing insufficient cleaning or overetching.

Since the cleaning gas temperature measuring means is disposed at the position on the downstream side of the processing chamber with respect to the flowing direction of the cleaning gas in the processing vessel, such as a position near the exhaust port, the cleaning operation terminating point can properly be determined.

Since the cleaning operation terminating point is the predetermined time after the variation of the measured temperature past the peak, the unnecessary film can completely be removed.

Since the thermocouples for monitoring temperature during a film forming process are used also as the cleaning gas temperature measuring means, the present invention can be carried out without requiring additional temperature measuring means.

What is claimed is:

1. A cleaning method of cleaning a film forming system for processing a workpiece by a film forming process, said method comprising the steps of:
   producing currents of a cleaning gas in a processing chamber defined by a processing vessel included in the film forming system to clean the processing vessel;
   continuously measuring the temperature of a gas contained in the processing vessel for a necessary time by a plurality of gas temperature sensors disposed from an upstream region to a downstream region with respect to the flowing direction of the cleaning gas in the processing vessel, wherein said plurality of gas temperature sensors include a lowermost gas temperature sensor disposed in a most downstream region nearest to an exhaust port for discharging gases from the processing vessel; and
   determining a cleaning operation terminating point on the basis of the variation of measured temperature measured by the lowermost gas temperature sensor with time, wherein the step of determining a cleaning operation terminating point determines the cleaning operation terminating point upon the variation of the measured temperature past a peak.

2. The cleaning method according to claim 1, wherein the processing vessel comprises an inner cylinder and an outer cylinder disposed coaxially with the inner cylinder so as to define an annular space between the inner and the outer cylinder, and the lowermost gas temperature sensor is disposed in the outer cylinder.

3. The cleaning method according to claim 2, wherein the step of determining a cleaning operation terminating point determines the cleaning operation terminating point upon the variation of the measured temperature past a second peak.

4. The cleaning method according to claim 1, wherein the cleaning operation terminating point is a predetermined time after a time point when the measured temperature varies past the peak.

5. The cleaning method according to claim 1, wherein the cleaning gas is $ClF_3$ gas.

6. The cleaning method according to claim 1, wherein the pluarity of gas temperature sensors measure the temperature of the cleaning gas.

7. The cleaning method according to claim 1, introducing a holder for holding the workpiece into the processing vessel,
   wherein the holder is cleaned together with the processing vessel.

8. A cleaning system for cleaning a film forming system which processes a workpiece by a film forming process by supplying a process gas into a processing chamber defined by a processing vessel, said cleaning system comprising:
   a cleaning gas supply unit that supplies a cleaning gas into the processing vessel;
   a plurality of gas temperature measuring sensors disposed from an upstream region to a downstream region with respect to the flowing direction of the cleaning gas in the precessing vessel to measure the temperature of a gas in the proccssing chamber, wherein said plurality of gas temperature sensors include a lowermost gas temperature sensor disposed in a most downstream region nearest to an exhaust port for discharging gases from the precessing vessel; and
   a cleaning operation terminating point determining unit that determines a cleaning operation terminating point where a cleaning operation is to be terminated on the basis of the time-varying measured temperature of the gas measured by the lowermost gas temperature sensor, wherein the cleaning operation terminating point determining unit determines that the cleaning operation is to be terminated at a time point a certain time after variation of the measured temperature past a peak.

9. The cleaning system according to claim 7, wherein the processing vessel comprises an inner cylinder and an outer cylinder disposed coaxially with the inner cylinder so as to define an annular space between the inner and the outer cylinder, and the lowermost gas temperature sensor is disposed in the outer cylinder.

10. The cleaning system according to claim 9, wherein the cleaning operation terminating point determining unit determines a cleaning operation terminating point in response to the variation of the measured temperature past a peak, and determines that the cleaning operation is to be terminated upon the variation of the measured temperature past the second peak.

11. The cleaning system according to claim 10, wherein a thermocouple is inserted in the annular space to monitor temperature during a film forming process, and the thermocouple is used as the cleaning gas temperature sensor.

12. The cleaning system according to claim 7, wherein the gas temperature measuring sensors measure the temperature of the cleaning gas.

13. A film forming system for processing a workpiece by a film forming process, said film forming system comprising:
   a processing vessel defining a processing chamber through which a process gas flows; and
   a cleaning system for cleaning the interior of the processing vessel;

wherein the cleaning system comprises:

a cleaning gas supply unit that supplies a cleaning gas into the processing vessel;

a plurality of gas temperature measuring sensors that are disposed from an upstream region to a downstream region with respect to the flowing direction of the cleaning gas in the processing vessel to measure the temperature of a gas in the processing chamber, wherein said plurality of gas temperature sensors include a lowermost gas temperature sensor disposed in a most downstream region nearest to an exhaust port for discharging gases from the processing vessel; and a cleaning operation terminating point determining unit that determines a cleaning operation terminating point where a cleaning operation is to be terminated on the basis of the time-varying measured temperature of the gas measured by the lowermost gas temperature sensor, wherein the cleaning operation terminating point determining unit determines that the cleaning operation is to be terminated at a time point a certain time after variation of the measured temperature past a peak.

14. The film forming system according to claim 12, wherein the cleaning operation terminating point determining means determines that the cleaning operation is to be terminated at a time point a certain time after the variation of the measured temperature past a peak.

15. The cleaning system according to claim 13, wherein the processing vessel comprises an inner cylinder and an outer cylinder disposed coaxially with the inner cylinder so as to define an annular space between the inner and the outer cylinder, and the lowermost gas temperature sensor is disposed in the outer cylinder.

16. The film forming system according to claim 15, wherein the cleaning operation terminating point determining unit determines a cleaning operation terminating point in response to the variation of the measured temperature past a peak, and determines that the cleaning operation is to be terminated upon the variation of the measured temperature past the second peak.

17. The film forming system according to claim 16, wherein a thermocouple is inserted in the annular space to monitor temperature during a film forming process, and the thermocouple is used as the cleaning gas temperature sensor.

18. The film forming system according to claim 13, wherein the gas temperature measuring sensors measure the temperature of the cleaning gas.

\* \* \* \* \*